(12) United States Patent
Ryner et al.

(10) Patent No.: US 7,319,784 B2
(45) Date of Patent: Jan. 15, 2008

(54) MAGNETIC RESONANCE SPECTROSCOPY USING A CONFORMAL VOXEL

(75) Inventors: Lawrence N. Ryner, Winnipeg (CA); Garrett Westmacott, Winnipeg (CA); Peter Latta, Winnipeg (CA); Norman E. Davison, Winnipeg (CA)

(73) Assignee: National Research Council of Canada, Ottawa (CA)

( * ) Notice: Subject to any disclaimer, the term of this patent is extended or adjusted under 35 U.S.C. 154(b) by 686 days.

(21) Appl. No.: 10/771,121

(22) Filed: Feb. 4, 2004

(65) Prior Publication Data

US 2004/0218796 A1    Nov. 4, 2004

Related U.S. Application Data

(60) Provisional application No. 60/444,871, filed on Feb. 5, 2003.

(51) Int. Cl.
*G06K 9/00*    (2006.01)

(52) U.S. Cl. .............. 382/131; 324/307; 324/309; 345/620

(58) Field of Classification Search .............. 382/131, 382/154; 345/620; 324/307
See application file for complete search history.

(56) References Cited

U.S. PATENT DOCUMENTS

| | | | | |
|---|---|---|---|---|
| 4,480,228 A | * | 10/1984 | Bottomley | .......... 324/309 |
| 5,374,889 A | * | 12/1994 | Leach et al. | .......... 324/309 |
| 5,903,149 A | * | 5/1999 | Gonen et al. | .......... 324/307 |
| 6,137,290 A | * | 10/2000 | Hurd et al. | .......... 324/307 |
| 6,618,605 B1 | * | 9/2003 | Wolff et al. | .......... 600/410 |
| 7,079,680 B2 | * | 7/2006 | Baumberg | .......... 382/154 |
| 2006/0197780 A1 | * | 9/2006 | Watkins et al. | .......... 345/620 |

OTHER PUBLICATIONS

J.H. Duyn et al, Radiology 188 (1993) 277-282—Multisection Proton MR Spectroscopic Imaging of Brian 6 (pages).

T.C. Tran et al MRM 43 (3000) 23-33—Very Selective Suppressions Pulses for Clinical MRSI Studies of Brain and Prostate Cancer (11 pages).

\* cited by examiner

*Primary Examiner*—Samir Ahmed
*Assistant Examiner*—Nancy Bitar
(74) *Attorney, Agent, or Firm*—Adrian D. Battison; Michael R. Williams; Ryan W. Dupuis

(57) ABSTRACT

The goal was to automate and optimize the shaping and positioning of a shape-specific/conformal voxel that conforms to any volume of interest, such as a cranial lesion, to allow conformal voxel magnetic resonance spectroscopy (CV-MRS). We achieved this by using a computer program that optimizes the shape, size, and location of a convex polyhedron within the volume of interest. The sides of the convex polyhedron are used to automatically prescribe the size and location of selective excitation voxels and/or spatial saturation slices. For a spherically-shaped, phantom-simulated lesion, CV-MRS increased the signal from the lesion by a factor of 2.5 compared to a voxel completely inside the lesion. CV-MRS reduces the voxel prescription time, operator subjectivity, and acquisition time.

8 Claims, 3 Drawing Sheets

Conformal voxel with 8 VSS pulses.

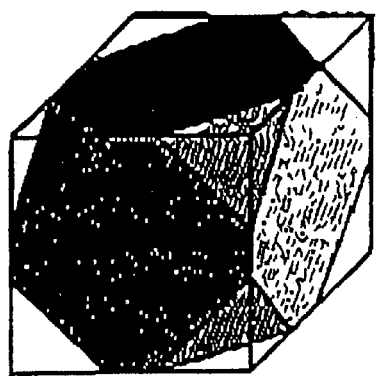
Fig. 1: Conformal voxel with 8 VSS pulses.
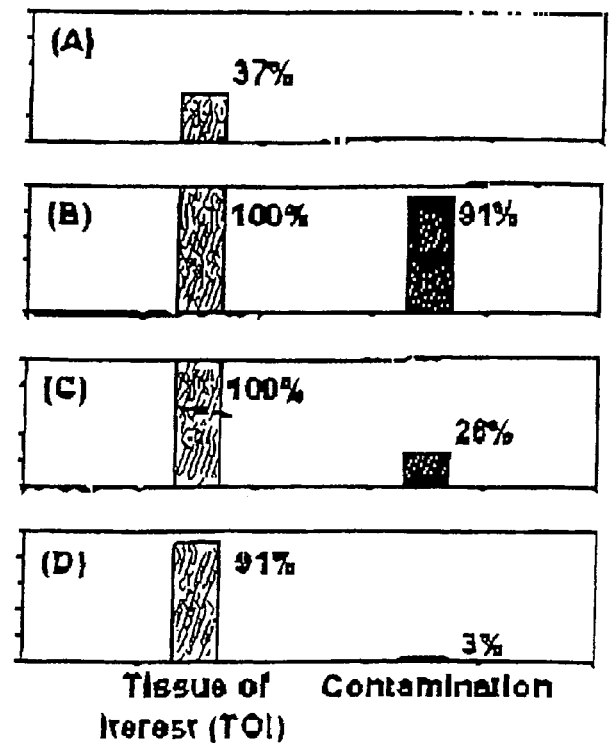
Fig. 2: TOI and contamination sampled for (A) cubic voxel within sphere, (B) cubic voxel just encompassing the sphere, (C) CV-MRS with 8 VSS pulses, (D) CV-MRS with 20 VSS pulses.

MAGNETIC RESONANCE SPECTROSCOPY USING A CONFORMAL VOXEL

This application claims priority under 35 U.S.C.119 from U.S. Provisional Application Ser. No. 60/444,871 filed 5 Feb. 2003.

This invention relates to in vivo magnetic resonance spectroscopy and/or in-vivo magnetic resonance spectroscopic imaging and specifically to automating and optimizing the placement and shape of a "conformal voxel" which optimally conforms to an arbitrarily-shaped volume of interest from which spectral signal is desired.

BACKGROUND OF THE INVENTION

Clinical magnetic resonance spectroscopy (MRS), both single-voxel MRS and multi-voxel magnetic resonance spectroscopic imaging (MRSI), requires the spatial localization of a volume of interest. The problem is to spatially localize a volume from which to acquire a MRS spectrum that only includes the volume of interest (VOI)—a brain tumor, prostate, or an entire brain, for example—and excludes regions outside the VOI. The overall goal is to produce clinically-beneficial MR spectra that accurately and exclusively represent the VOI.

This is typically accomplished by methods such as Selective Excitation, Outer Volume Suppression/Presaturation, or some combination of these. For selective excitation, conventional methods (pulse sequences) include Point Resolved Spectroscopy (PRESS, see U.S. Pat. No. 4,480,228) and Stimulated Echo Acquisition Mode (STEAM). These pulse sequences excite regions of space (voxels) that are shaped as right parallelepiped (rectangular/cuboidal) volumes.

Outer Volume Suppression (OVS) techniques involve spoiling (zeroing) the magnetization outside the VOI. As a result, these spoiled regions, in theory, do not contribute to the MRS spectrum. OVS is accomplished using successive slice-selective, radio-frequency (rf) pulses and strong gradient pulses to suppress the signal from selected slices. Various techniques for OVS have been developed. However, due to the poor spatial selectivity of OVS rf pulses, these techniques are not suited for use as a primary localization technique. In spite of this limitation, these techniques have been successfully applied in concert with selective excitation techniques to shape the excitation volume. For example, as shown in J. H. Duyn, et al, Radiology 188 (1993) 277-282 (Multi-section proton MR spectroscopic imaging of the brain), a clinical MRS application which employs OVS and selective excitation is MRSI of the brain, in which OVS rf pulses are manually positioned to shape the localized VOI such that the signal from subcutaneous lipid layers are suppressed.

More recently, as shown in T. C. Tran, et al, MRM 43 (2000) 23-33 (Very selective suppression pulses for clinical MRSI studies of brain and prostate cancer), Very Selective Saturation (VSS) rf pulses have been introduced as an improvement to previously-used OVS spatial saturation pulses. The VSS rf pulses have spatial edge profiles that are about an order of magnitude sharper than traditional OVS rf pulses as described in U.S. Pat. No. 6,137,290 (Hurd et al) issued 24 Oct. 2000 entitled "Magnetic resonant spectroscopic imaging having reduced chemicals shift error".). The application of VSS rf pulses has been successfully demonstrated for clinical MRSI of the brain and prostate. In these cases, the VSS rf pulses were used to suppress signal from the subcutaneous and periprostatic lipid layers for the brain and prostate, respectively, and to significantly reduce the chemical shift displacement effect.

With the above techniques, defining the size and location of excitation voxels (for selective excitation) and/or spatial saturation slices (for outer volume suppression) is done manually using a computer graphical-user interface. Using a computer mouse and keyboard, the scanner operator defines a rectangular box, which represents the excitation cuboidal voxel, and lines, which represent spatial saturation slices (slice volumes in which the magnetization is spoiled by spatial saturation pulses). For analyzing brain tumors using single-voxel MRS, the standard practice is to define a relatively small cuboidal region (the excitation voxel) somewhere entirely within the tumor. Using MRSI, the standard practice is define a relatively large voxel which encompasses the VOI, e.g., brain or prostate, and apply spatial saturation pulses to suppress signal from undesired (eg adipose) tissue that is adjacent to, or within the voxel.

For single-voxel MRS of brain tumors, in which a small voxel is typically defined entirely within the tumor, a limitation is that there will be regions of the tumor not sampled. Thus, since brain tumors are heterogeneous, the resultant spectrum could vary depending on where the operator of the scanner places the voxel inside the tumor. This introduces subjectivity into the results. Furthermore, if part of the cuboidal voxel happens to contain regions from outside of the VOI, then part of the total signal will be contaminated by unwanted signal from outside the VOI. To suppress unwanted signal from outside the VOI, spatial saturation slices, as produced, for example, by VSS pulses, could be manually positioned via a computer interface, but it can be difficult and time-consuming to accurately and optimally position the spatial saturation slices in 3D, especially while only viewing 2D image slices, which is standard for image-viewing with commercial MRI scanners. Another problem with using a relatively small voxel is that more time is needed to acquire a spectrum with acceptable signal-to-noise, as compared to using a larger voxel.

For MRSI, manually placing spatial saturation slices, via a computer interface, suffers from a similar limitation as with single-voxel MRS. Frequently with MRSI measurements there are also regions around the VOI which need to be excluded ("volumes of exclusion," VOE), for example, subcutaneous lipid layers or lipid around the prostate. It is difficult and time-consuming to manually locate excitation voxels and spatial saturation slices that optimally excludes/suppresses the VOE from contributing to the spectral signal from the VOI.

SUMMARY OF THE INVENTION

It is one object of the present invention to provide an improved method of shaping and positioning a "conformal" voxel around or within a volume of interest for use in MRS, and to provide an improved method of MRS using the method.

According to the invention there is provided a method comprising:

defining an arbitrarily-shaped volume of interest (VOI) inside a 3D computer image containing also non-VOI material;

using a numerical optimization algorithm to find an optimum convex polyhedron, such that the volume of the polyhedron contains a maximum volume of the VOI and a minimum (or zero) volume of non-VOI;

and evaluating and optimizing the convex polyhedron with pre-defined parameters, including a maximum allowable amount of non-VOI allowed inside the convex polyhedron, a maximum allowable amount of VOI allowed outside the convex polyhedron and a maximum number of sides of the polyhedron.

In one alternative the method may include segmenting the VOI into two or more sub-VOIs if the optimized convex polyhedron does not satisfy the pre-defined parameters, and re-using the numerical optimization algorithm on each new sub-VOI.

Preferably the method includes defining a volume of exclusion (VOE) and evaluating and optimizing the convex polyhedron with a pre-defined parameters of a maximum allowable amount of VOE allowed inside the convex polyhedron.

Preferably the VOI inside the 3D computer image is defined using an automated image segmentation algorithm.

In particular, one important but not essential use of the invention includes using the polyhedron to automate and optimize the definition of a conformal voxel for a specific lesion and carrying out in-vivo magnetic resonance spectroscopy and/or in-vivo magnetic resonance spectroscopic imaging using the conformal excitation voxel wherein the planes of the convex polyhedron are used to define/prescribe the size and location of selective excitation volumes and/or spatial saturation slices.

Preferably the number of sides defining the polyhedron is selected to be an acceptable number for in-vivo magnetic resonance spectroscopy and/or in-vivo magnetic resonance spectroscopic imaging.

In one arrangement, if the VOI is segmented into sub-VOIs, then multiple spectra can be acquired from each conformal voxel containing the sub-VOIs;

In another arrangement, if the VOI completely surrounds non-VOI, then two conformal voxels are generated, one for the VOI and non-VOI together, and another conformal voxel for only the non-VOI, and the final spectra for the VOI is calculated by subtracting the spectra from each of the conformal voxels, which gives a final spectrum of just the VOI.

Preferably the method includes providing a data base of spectra from conformal voxels around and/or within specific lesions where each conformal voxel is defined by a respective polyhedron calculated for the specific lesion and comparing the spectrum from the lesion with the data base to provide a diagnosis of the lesion.

While the methods herein refer primarily to VSS pulses, it is only one available method for generating spatial saturation slices, and other such methods may be used herein. Furthermore, while the methods herein refer primarily to using jointly cuboidal selective excitation voxels (generated by the PRESS pulse sequence) and spatial saturation pulses (generated by VSS pulses), it is only one available method for generating a conformal excitation voxel (a localized volume) around or within some arbitrarily-shaped VOI, and other such methods may be used herein.

The method disclosed herein automates and optimizes the shaping and positioning of conformal voxels that contain (localize) a maximum volume of the VOI and a minimum (or zero) volume of non-VOI or volume to be excluded (VOE). The goal is to produce a shape-specific voxel that optimally conforms to any arbitrarily-shaped VOI, for example, a cranial lesion or an entire organ, to allow "conformal voxel magnetic resonance spectroscopy".

Given some arbitrarily-shaped VOI, like a brain tumor or an entire organ, an ideal conformal voxel in an MRS or MRSI measurement would exclusively excite the VOI and not excite any other regions outside the VOI. Thus, spectral signal would be acquired only from the entire VOI and no other regions outside the VOI. For the invention described herein, the term "conformal voxel" refers to an optimized approximation of an ideal conformal voxel.

A computer program is used to perform the optimization procedure, which is done in two steps. First, the program can define the VOI from the input images automatically, using established computer algorithms, or manually, by allowing user assistance. In the second step, the program numerically optimizes an n-sided convex polyhedron (a volume formed by planes), such that the convex polyhedron contains a maximum amount of the VOI and a minimum (or zero) amount of non-VOI or VOE. For MRS or MRSI measurements using the standard PRESS pulse sequence and VSS pulses, 6 of the sides of the convex polyhedron are constrained to form a parallelepiped and are used to define the shape and position of the selective excitation voxel, and the remaining sides of the convex polyhedron are used to define the position of the spatial saturation slices.

IDL and C++ computer programs can perform calculations necessary to identify the VOI, and determine the optimum shape and position of conformal voxels. It is also possible to use a Java-based graphical user interface that is coupled with the code that performs the optimization. A modified PRESS pulse sequence reads the output coordinates of the planes from the optimization algorithm, and applies the coordinates to numerically prescribe the excitation voxels and spatial saturation slices.

The method disclosed herein can be used as a clinical tool for improving the prescription of a localized volume around any arbitrarily-shaped VOI. The method disclosed herein is compatible with any modern, on-the-market clinical MRI scanner, and, thus, could potentially be an additional feature incorporated by any manufacture (GE, Siemens, Philips, Bruker, Varian, etc.). The method disclosed herein also has potential uses in any hospital or clinic which has a magnetic resonance scanner.

The method disclosed herein can be used to generate optimum planar boundaries of a localized volume for single voxel MRS measurements, or the invention can also be used to optimally isolate the VOI from specified volumes to be excluded (VOE in a MRSI measurement).

The method disclosed herein can also be used to generate conformal voxels for use in acquiring spectra in a consistent, objective manner independent of operator variability for use in a method of comparing the spectra with previously acquired spectra contained in a data base for use in clinical diagnosis of the tissue in the VOI.

BRIEF DESCRIPTION OF THE DRAWINGS

FIG. 1 is a schematic illustration of a volume of interest using 8 planes to define the location of the VSS pulses.

FIG. 2 is a series of graphs showing the VOI and contamination sampled for (A) cubic voxel within sphere, (B) cubic voxel just encompassing the sphere, (C) CV-MRS with 8 VSS pulses, (D) CV-MRS with 20 VSS pulses.

DETAILED DESCRIPTION

Figure 3:
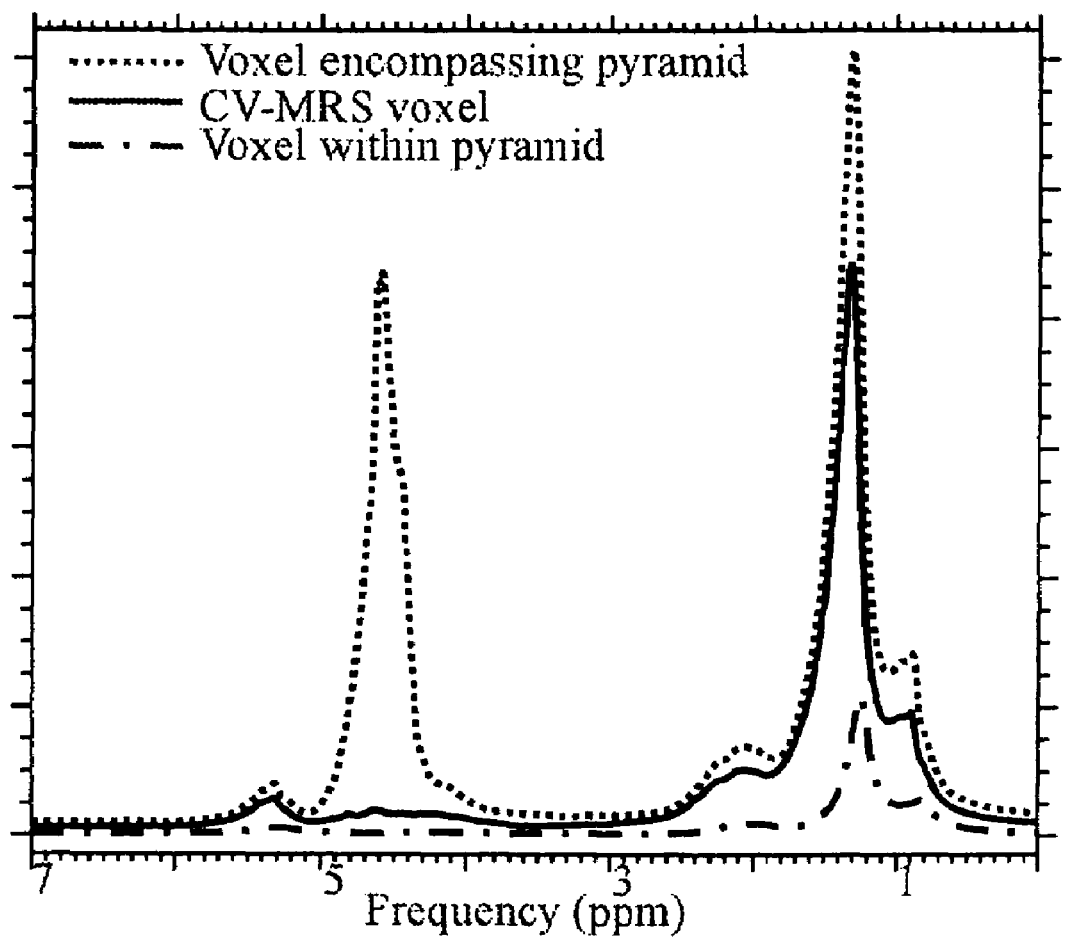
FIG. 3 is a graph showing the experimental VOI signal and contamination sampled for (A) cubic voxel within a pyramidal-shaped VOI, (B) cubic voxel just encompassing the sphere, (C) CV-MRS with 20 VSS pulses.

A series of images is acquired using magnetic resonance imaging. The images are of thin, closely spaced slices along any axis. The field of view of all the images is large enough to completely contain the VOI.

The images are automatically extracted from the MRI scanner computer and are displayed on a computer terminal.

The user can locate a point in the VOI, and the program automatically finds the entire VOI in all the slices using conventional image analysis techniques well known to persons skilled in the art of image analysis. For example, image analysis techniques include MR image segmentation and seed-growing algorithms.

If desired, the user can manually define the VOI directly on the image using a computer interface.

If desired, the computer program or user can also define volumes of exclusions (VOE), a region, e.g., subcutaneous lipid layers, to be minimally (or not) included inside the cuboidal excitation voxel (created using a localizing sequence like PRESS or STEAM).

Once the VOI is defined, by whatever means, a numerical optimization algorithm finds a convex polyhedron volume with n sides, such that inside the volume there is a maximum volume of the VOI and minimum (or zero) volume of the non-VOI. The optimized convex polyhedron can then be used to prescribe the location of selective excitation voxels and/or spatial saturation slices. The optimal number of sides, n, for the convex polyhedron can be determined manually or automatically; however, it is limited by physical and/or MRS scanner constraints, and it cannot be greater than the number of sides that can be accommodated by the MRS measurement. For MRS using the PRESS selective excitation method, at least six planes are required to define a cuboidal excitation voxel, where these six planes define the location and thickness of the three slice-volumes representing the three slice-selective pulses of the PRESS sequence. Thus, six of the planes/sides of the convex polyhedron must be constrained during the optimization procedure to form a parallelepiped in any orientation. The six planes used for defining the cuboidal excitation volume can be numerically optimized with the additional constraint as to minimize (or zero) the volume of a pre-specified VOE, e.g., subcutaneous lipid layers. The remaining planes/sides of the convex polyhedron that are not used to define the size and position of the selective excitation voxel can be used to locate spatial saturation slices.

The optimization procedure is constrained by two user-defined limits: the maximum fraction of the VOI allowed outside the conformal volume, and the maximum ratio of the non-VOI to VOI allowed inside the conformal volume, which may be set to zero. If there does not exist a conformal volume that falls within the set limits, then the VOI may be segmented into smaller volumes, such that each sub-VOI volume can be enclosed by a conformal volume that falls between the two limits. For example, if the VOI is a concave or a "peanut-shaped" volume, then the volume will be optimally segmented into multiple smaller sub-volumes, where to each new sub-VOI volume the optimization algorithm can be applied.

The optimized coordinates are transferred to the MRI scanner, which prescribes the voxel and saturation pulses.

Figure 4:
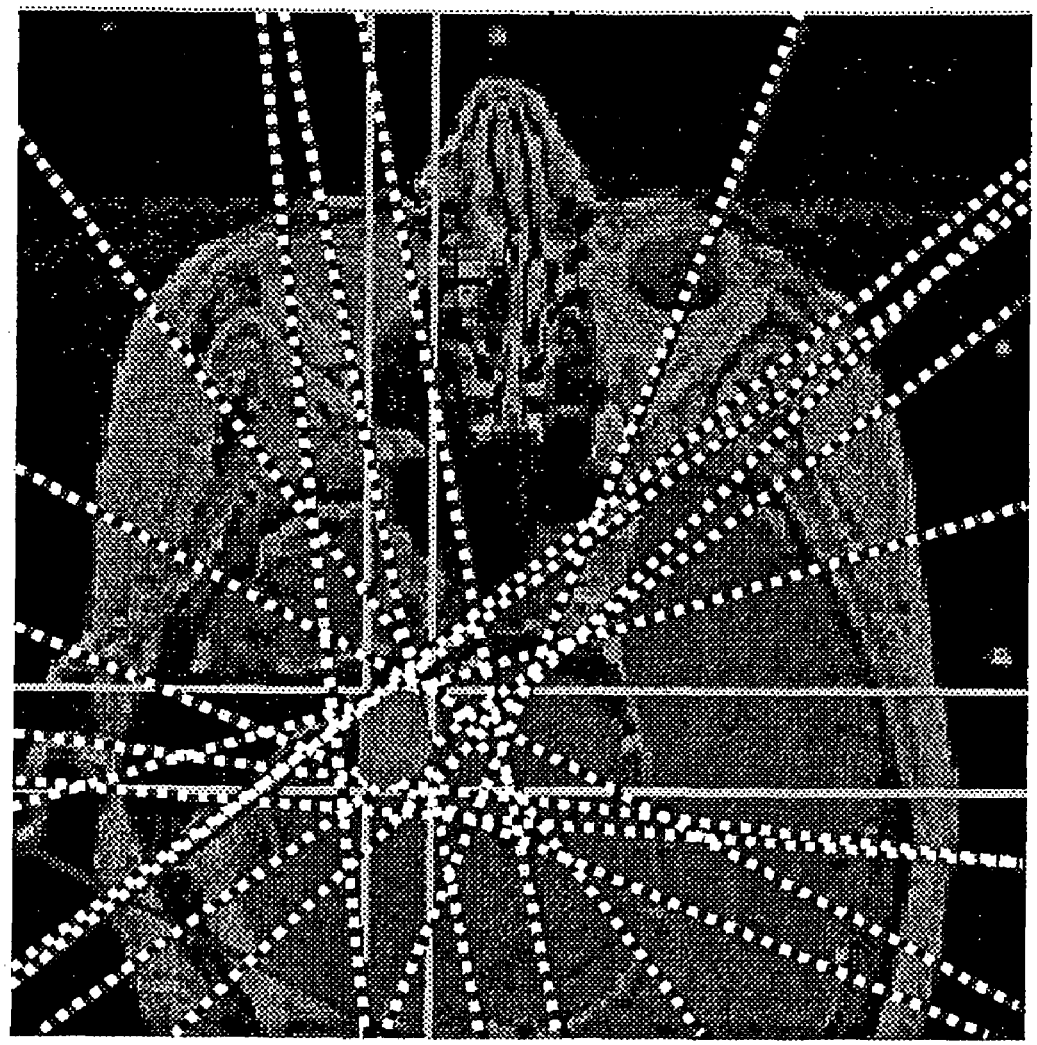
FIG. 4 is an image showing an MRI of a head with a tumor and the implementation of CV-MRS. The dashed lines show the position of 20 VSS planes which were automatically positioned to shape the excitation voxel to conform to the tumor.

Theoretical results for a spherical VOI are shown in FIGS. 1 and 2. FIG. 1 shows a sample conformal voxel for a spherically shaped VOI using a 14-sided convex polyhedron, where six sides were constrained to form a rectangular box (a right parallelepiped). If a cubic excitation voxel is placed completely inside the VOI, then only 37% of the VOI is sampled (FIG. 2A). This is the usual practice for positioning single voxels inside brain tumors. The other extreme is a cubic voxel which contains the entire VOI. In such cases, 100% of the VOI is sampled, however the total signal also includes contamination from regions (healthy tissue) outside the VOI—91% contamination relative to the VOI volume (FIG. 2B). With further refining of the voxel by applying 8 optimally positioned saturation pulses, the amount of contamination from outside the VOI is reduced to 26% with respect to the VOI, while 100% of the VOI is still sampled. By increasing the number of saturation pulses to 20, and allowing a small amount of the VOI to be saturated, the amount of contamination can be reduced to 3% with respect to the VOI, while still sampling 91% of the VOI (FIG. 2D). This is a factor of about 2.5 improvement in signal compared to a voxel completely inside the VOI, which could be traded for a 6-fold reduction in scan-time, for a spectrum of equivalent signal-to-noise ratio Experimental results are shown in FIGS. 3 and 4. FIG. 3 shows three spectra from a phantom containing a pyramidal-shaped vial filled with olive oil placed within a larger vial containing water. The VOI in this case is the pyramidal-shaped vial of olive oil. The water outside the phantom represents undesirable signal from outside the VOI. The first spectrum with the dashed line is from a cuboid voxel which contains the entire VOI—a cuboid voxel was positioned and sized such that the entire pyramidal VOI was just encompassed by the voxel, including significant signal from outside the VOI at the corners of the cuboid voxel. The spectrum shows a large peak on the right from the oil at 1.3 ppm, representing the signal from the entire oil-filled pyramid. The large peak on the left at 4.7 ppm is from the water outside the VOI but within the cuboid excitation voxel. This water signal represents contamination from outside the desired VOI. If a cuboid excitation voxel is placed completely inside the VOI, then only 17% of the VOI is sampled, as seen in FIG. 3 in the spectrum with the dot-dash line showing a greatly reduced right peak (from the oil). Note that the peak on the left is now completely gone showing that the contamination signal from outside the VOI has been eliminated. This is at the expense of a greatly reduced VOI signal as seen in the small right peak from the oil within the pyramid which is reduced to 17% of the entire oil signal. The spectrum with the solid line is from a CV-MRS voxel corresponding to a 26-sided convex polyhedron, where six sides were constrained to form a rectangular box (a right parallelepiped) and the other 20 sides were automatically positioned around the VOI to conform the acquisition to the pyramidal-shaped vial. A much greater proportion of the VOI is now sampled with 73% of the oil signal, represented by the right peak, now acquired, with minimal signal from outside the VOI, represented by the absence of a water peak at 4.7 ppm on the left. The CV-MRS voxel provides a four-fold increase in VOI signal as compared to a cuboid voxel placed entirely within the pyramid which could be traded for a 16-fold reduction in scan-time, for a spectrum of equivalent signal-to-noise ratio FIG. 4 shows an MRI of a head with a tumor with the results of a CV-MRS voxel optimization for acquisition of a spectrum from the entire tumor, rather than a small cuboid voxel placed within the tumor. The dashed lines represent the positions of the 20 VSS saturation planes to shape the acquisition to conform to the irregularly-shaped tumor. The resulting conformal voxel is shown with a solid-line overlaid on the tumor. Note the irregular, non-cuboid shape.

Lesions and organs are irregularly shaped and thus it is advantageous to use shape-specific localization for MRS. For MRSI of the brain or prostate, for example, the objective is to optimally suppress lipid signal from outside the VOI. For single-voxel MRS, the objective is to acquire a representative spectrum of the VOI, maximizing the signal from the VOI while minimizing the signal from outside the VOI. For brain tumors, using single-voxel MRS, the standard practice is to place a relatively small cuboidal excitation volume entirely within the tumor. In doing so, there will be regions of the tumor not sampled, and, since tumors are heterogeneous, the voxel placement could affect the spectrum [2]. The CV-MRS technique we developed does not suffer from this problem. It provides an objective means of localization, where, in principle, spectra acquired by different technologists on the same cancer patient will produce the same spectrum. Furthermore, CV-MRS reduces the time to prescribe voxels and saturation pulses by automating the procedure, and reduces acquisition time by sampling a larger, optimized volume around the VOI. As shown above, a six-fold reduction in scan time can be achieved with the use of 20 optimally positioned spatial saturation planes around a spherical VoI.

One example of an algorithm which can be used for optimizing a convex polyhedron is set out as follows.

As a simple example of an optimization algorithm, consider optimizing a convex polyhedron with n sides to form a conformal voxel for some pre-defined VOI. Each side of the polyhedron is represented by a plane defined in the scanner's coordinate system. The planes are initially located near the edge of the field of view (FOV) and are approximately uniformly distributed about a point at the center of the FOV. Then the position of each of these planes is adjusted using a standard optimization algorithm, e.g. Amoeba or Powell, such that inside the conformal voxel the number of non-VOI pixels is minimized and the number of VOI is maximized. If the ratio of contamination (non-VOI) inside the conformal voxel to total volume of conformal voxel is less than some user-defined limit, and if the ratio of VOI to total VOI outside the conformal voxel is less than some user-defined limit, then the optimization was successful. However, if one or both of these limits are not satisfied, then the VOI can be split (automatically or manually) into sub-VOIs. For MRS measurements using pulse sequences like PRESS, which requires a cuboidal excitation voxel, the number of sides of the convex polyhedron must be greater than 6, and 6 out of the total number of sides are constrained to form a parallelepiped in any spatial orientation. These 6 sides are used to define the location and size of the selective excitation voxel for PRESS.

The above is one example of an algorithm. There are other more complex algorithms. For example, algorithms which can:

- account for a volume of exclusion (VOE), e.g., a subcutaneous lipid layer, which can be minimally (or not) included in the selective excitation volume, and/or optimally saturated with spatial saturation pulses.
- use and test multiple initial positions for the orientations of the planes;
- recursively refine the position of one plane at a time;
- optimize the number of sides, n, of the convex polyhedron while limiting it to the value less than that which can be accommodated by the MRS measurement.

Another example of an optimization algorithm with more details and complexity is as follows: Data describing the VOI are presented to the algorithm in the form of a number of "image slices" of a field of view (FOV) that contains the VOI and surrounding tissue (non-VOI). The thickness of each slice is known in absolute terms (millimetres) and the separation between the slices is also known. Within each slice the pixels corresponding to the VOI are identified, e.g., VOI pixels are set to 1 and all others are set to 0. The goal of the algorithm is to identify a set of planes such that they form a volume ("conformal voxel") that contains as much of the VOI as possible and with a minimum amount (possibly zero) of the non-VOI.

Additional information supplied to the optimization algorithm includes: the number, n, of planes to be optimized—in principle, this parameter could be determined by the algorithm itself; the maximum allowable fraction of non-VOI inside the conformal voxel; the minimum number of pixels of VOI inside the conformal voxel; and the maximum allowable fraction of VOI to total VOI allowed outside the conformal voxel.

The algorithm proceeds in several stages which are listed here and described in more detail below:

1. Fit an "active contour" or "snake" to the VOI.
2. Determine the "convex hull" of the VOI.
3. Decide whether the VOI should be split into smaller sections.
4. Choose optimal starting point for each plane of the conformal voxel.
5. Adjust position and orientation of each plane to optimize enclosed volume.
6. Evaluate results by comparing the enclosed volume, the snake and the convex hull.

Snake: This step provides a readily useable outer contour of the VOI in each slice. The contour can be fit (under operator control) either very tightly to the VOI or loosely, ignoring fine details of the VOI edge. The resultant contour is called a snake. The snake is not necessarily convex in shape. (A convex shape is a shape such that any two points within the shape can be joined together by a line that lies entirely within the shape).

Convex Hull: Similar to Step 1, a convex shape (a convex hull) is fit to enclose the snake and, therefore, the VOI, in each image slice. If the snake is convex (i.e., not "peanut-shaped"), then the snake and hull will be very similar, if not identical.

Decision whether or not to split VOI into sub-VOI: If the snake and hull are different, that is if the VOI is not convex, then depending on degree of the difference, a decision will be made as to whether to (1) calculate the conformal voxel for the entire VOI as it is, or (2) to break the VOI into parts (sub-VOIs) and calculate conformal voxels for each sub-VOI. In the latter case, the sub-VOIs can be determined either automatically or with operator guidance.

Optimal Initial Planes: A small library contained within the optimization computer code is used to position the n planes of the conformal voxel around the edge of the FOV. If the PRESS or STEAM pulse sequence is used for the MRS measurement, then the total number of planes must be greater than 6, and 6 out of the total number of planes are set to form a parallelepiped.

Optimize Planes: The optimization algorithm then performs two steps. First, it uses a large number of initial orientations of the set of planes (from the library) to seek an optimal initial orientation. For each orientation of the set of planes, the optimization algorithm moves the planes inwards (translates the position of the planes) until each plane just touches the VOI. The orientation that produces the volume that contains the smallest amount of non-VOI is use for the next step. The second step is involves refining the orientation and position of each plane so as to maximize the fraction of the VOI and minimize the faction of non-VOI contained within the planes. Any of a number of optimization algorithms can be used to adjust the planes in any of several modes: all planes adjusted simultaneously, several at a time, or one at a time. If the PRESS or STEAM sequence is used for selective excitation, then the 6 planes that are initially set to from a parallel piped volume are constrained during optimization to maintain a parallelepiped but are allowed to change in position.

Evaluate Results: The resulting conformal voxel (a 3-dimensional volume) can be compared with the snakes and convex hulls (2-dimensional) obtained for each slice. If any part of the conformal voxel lies exterior to the hull it may be possible to improve the quality of the voxel by adding additional plane(s), and by refitting ab initio or by continuing from the point reached in the first fit. Furthermore, the conformal voxel is checked for the fraction of non-VOI, the number of pixels of VOI, and the fraction of VOI to total VOI inside the conformal voxel. If these criteria are not met, then it may be necessary to split or re-split the VOI into sub-VOIs and refit each sub-VOI one at a time.

Since various modifications can be made in this invention as herein above described, and many apparently widely different embodiments of same made within the spirit and scope of the claims without departing from such spirit and scope, it is intended that all matter contained in the accompanying specification shall be interpreted as illustrative only and not in a limiting sense.

The invention claimed is:

1. A method for magnetic resonance spectroscopy experiments of an element to be examined in a patient comprising:
    defining an arbitrarily-shaped volume of interest (VOI) of the element inside a 3D computer image of the patient containing also non-VOI material;
    using a numerical optimization algorithm to find an optimum convex polyhedron, such that the volume of the polyhedron contains a maximum volume of the VOI and a minimum (or zero) volume of non-VOI;
    evaluating and optimizing the convex polyhedron with pre-defined parameters, including a maximum allowable amount of non-VOI allowed inside the convex polyhedron, a maximum allowable amount of VOI allowed outside the convex polyhedron and a maximum number of sides of the polyhedron;
    using the polyhedron to automate and optimize the definition of a conformal voxel for the element in the patient;
    and carrying out magnetic resonance spectroscopy of the patient using the conformal excitation voxel;
    wherein the planes of the convex polyhedron are used to define/prescribe the size and location of selective excitation volumes and/or spatial saturation slices of the magnetic resonance spectrospopy.

2. The method according to claim 1 including segmenting the VOI into two or more sub-VOIs if the optimized convex polyhedron does not satisfy the pre-defined parameters, and re-using the numerical optimization algorithm on each new sub-VOI.

3. The method according to claim 1 including defining a volume of exclusion (VOE) and evaluating and optimizing the convex polyhedron with a pre-defined parameters of a maximum allowable amount of VOE allowed inside the convex polyhedron.

4. The method according to claim 1 wherein the VOI inside the 3D computer image is defined using an automated image segmentation algorithm.

5. The method according to claim 1 wherein the number of sides defining the polyhedron is selected to be an acceptable number for in-vivo magnetic resonance spectroscopy and/or in-vivo magnetic resonance spectroscopic imaging.

6. The method according to claim 1 wherein if the VOI is segmented into sub-VOIs, then multiple spectra can be acquired from each conformal voxel containing the sub-VOIs.

7. The method according to claim 1 wherein if the VOI completely surrounds non-VOI, then two conformal voxels are generated, one for the VOI and non-VOI together, and another conformal voxel for only the non-VOI, and the final spectra for the VOI is calculated by subtracting the spectra from each of the conformal voxels, which gives a final spectrum of just the VOI.

8. The method according to claim 1 wherein the element to be examined in the patient is a lesion and wherein the method further comprises providing a data base of spectra from conformal voxels around and/or within specific lesions where each conformal voxel is defined by a respective polyhedron calculated for the specific lesion and comparing the spectrum from the lesion with the data base to provide a diagnosis of the lesion.

* * * * *